(12) United States Patent
Lee

(10) Patent No.: US 7,747,890 B2
(45) Date of Patent: *Jun. 29, 2010

(54) METHOD AND APPARATUS OF HIGH-SPEED INPUT SAMPLING

(75) Inventor: Seonghoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 831 days.

This patent is subject to a terminal disclaimer.

(21) Appl. No.: 11/590,582

(22) Filed: Oct. 31, 2006

(65) Prior Publication Data

US 2007/0046515 A1 Mar. 1, 2007

Related U.S. Application Data

(63) Continuation of application No. 10/918,008, filed on Aug. 12, 2004, now Pat. No. 7,366,942.

(51) Int. Cl.
*G06F 1/04* (2006.01)
(52) U.S. Cl. .................................. 713/500; 713/502
(58) Field of Classification Search .................. 713/500, 713/501, 502, 503
See application file for complete search history.

(56) References Cited

U.S. PATENT DOCUMENTS

| | | | |
|---|---|---|---|
| 5,132,990 A | 7/1992 | Dukes | |
| 5,748,020 A | 5/1998 | Mactaggart et al. | |
| 5,910,920 A | 6/1999 | Keeth | |
| 6,064,704 A | 5/2000 | Liu et al. | |
| 6,378,020 B2 | 4/2002 | Farmwald | |
| 6,424,684 B1 | 7/2002 | Baker | |
| 6,430,696 B1 | 8/2002 | Keeth | |
| 6,724,846 B1 | 4/2004 | La | |
| 6,982,575 B2 | 1/2006 | Stong | |
| 7,366,942 B2 * | 4/2008 | Lee | 713/500 |
| 2004/0027185 A1 | 2/2004 | Fiedler | |
| 2004/0046590 A1 | 3/2004 | Singh et al. | |
| 2004/0120426 A1 | 6/2004 | Dagdeviren et al. | |

FOREIGN PATENT DOCUMENTS

EP  1 081 857 A1  3/2001

OTHER PUBLICATIONS

Vincent P. Heuring and Harry F. Jordan, "Computer Systems Design and Architecture," Addison-Wesley, 1997, pp. 519-520.
International Search Report dated Dec. 5, 2005 (4 pages).

* cited by examiner

*Primary Examiner*—Mark Connolly
*Assistant Examiner*—Paul B Yanchus, III
(74) *Attorney, Agent, or Firm*—TraskBritt

(57) ABSTRACT

A signal sampler and method for high-speed input sampling of a signal are disclosed. A first sampler samples a data signal at a rising edge of a clock signal and generates a first sampled signal. A second sampler samples the data signal at a falling edge of an inverted clock signal and generates a second sampled signal. The first and second sampled signals may be combined to determine the next signal sampler output. An evaluation may include asserting the output signal if the first and second sampled signals are asserted, negating the output signal if the first and second sampled signals are negated, and toggling the output signal if the first and second sampled signals are in opposite logic states. The signal sampler and method of signal sampling may be incorporated in a semiconductor device, which may be fabricated on a semiconductor wafer and included in an electronic system.

17 Claims, 4 Drawing Sheets

METHOD AND APPARATUS OF HIGH-SPEED INPUT SAMPLING

CROSS-REFERENCE TO RELATED APPLICATION

This application is a continuation of application Ser. No. 10/918,008, filed Aug. 12, 2004, now U.S. Pat. No. 7,366,942, issued Apr. 29, 2008,which is incorporated herein by reference.

BACKGROUND OF THE INVENTION

1. Field of the Invention

This invention relates generally to semiconductor integrated circuits and, more particularly, to high-speed input circuits.

2. Description of Related Art

In modern high frequency integrated circuits, the valid data window in which signal inputs are valid for sampling by a clock is continually shrinking as system clock frequencies continue to increase. For example, modern Double Data Rate (DDR) Dynamic Random Access Memory (DRAM) may have many communication signals, such as control inputs, data inputs, and address inputs that must be synchronously sampled by some form of high-speed clock signal.

The valid data window of a signal, defined from an output driver perspective is the period of time a signal may be valid after factoring in variable system parameters, such as process, temperature, voltage, and output loading. This valid data window is generally expressed in terms of a minimum propagation delay and a maximum propagation delay. The required data window, or sampling window, from an input sampling perspective is defined by the required time that the signal must be valid at the sampler prior to arrival of an active edge of the clock (i.e., setup time) and the required time that the signal must be held valid at the sampler after the active edge of the sampling clock (i.e., hold time). The valid data window and the sampling window combine to constrain the maximum operating frequency of a system. Reducing the sampling window will allow higher clock frequencies and allow more tolerance in system design parameters.

Once data signals and clock signals enter a semiconductor device, any divergence between how the signals are treated prior to arriving at a sampler, such as a flip-flop, widen the sampling window due to delay differences caused by buffers, routing, process, temperature and voltage variations. This is particularly true with clock signals, which may have large fan-out loads and require significant buffering to drive those loads. To compensate for the delay introduced by this clock buffering, many systems employ a Phase Locked Loop (PLL), or Delay Locked Loops (DLL) to remove any clock delay inserted by the clock buffering. These systems work well but are too complicated for many situations.

Conventionally, a sampling circuit 90 that does not incorporate a PLL or DLL may be similar to that shown in FIG. 1. In FIG. 1, a differential buffer 40 sensing transitions on an input clock 2 and an inverted input clock 4 generates an internal clock 12. The differential buffer 40 is used to enhance detection of a transition point by comparing the voltage on the input clock 2 to the voltage on the inverted input clock 4. A bus of data inputs 6 signals, D0 through Dn, is passed through a set of differential buffers 10, one for each data input 6, used for sensing transitions on the data inputs 6. The differential buffers 10 include one input connected to a voltage reference signal 8. The use of differential buffers 10 allows for faster sensing of input signal transitions, and lower voltage swings on the data inputs 6. The voltage reference signal 8 allows setting a voltage value where the transition is considered to have occurred.

After the differential buffers 10, the sensed data signals may pass through matched delays 50. Conventionally, these matched delays 50 may include active delay components, such as inverters, or may simply be metal routing lines used to delay the signal before arrival at the flip-flops 60. These matched delays 50 may be used to delay the signal by an amount similar to the delay on the internal clock 12.

By incorporating the differential buffers 10 and 40 and matched delays 50, the FIG. 1 embodiment of a sampling circuit 90 reduces the sampling window. However, as clock rates continue to increase, new circuitry and methods are needed to accurately receive and sample these communication signals with even smaller sampling windows.

There is a need for an apparatus and method that will reduce the sampling window required to accurately sample input signals without requiring complex PLL or DLL circuitry and, as a result, be capable of operation at higher clock frequencies and allow more tolerance in system designs.

BRIEF SUMMARY OF THE INVENTION

The present invention includes a method of sampling a high-speed signal and a signal sampler for sampling a high-speed signal by creating a reduced sampling window on the signal relative to a received clock signal, which may allow a system to operate at higher clock frequencies and allow more tolerance in system design. An embodiment of the present invention comprises a signal sampler including a first sampler, which may be a conventional flip-flop, configured to sample a data signal at an active transition of a clock signal and generate a first sampled signal. In addition, a second sampler, which may also be a conventional flip-flop, is configured to sample the data signal at an active transition of an inverted clock signal and generate a second sampled signal. The active transition of the clock and the active transition of the inverted clock may be substantially close in time so that the sampling time of the first sampler and the second sampler are substantially close. The outputs from the first sampler and the second sampler are operably coupled to an evaluator, which generates an output signal on the next active transition of the clock based on an evaluation of the first sampled signal, the second sampled signal, and a previous logic state of the output signal. In some embodiments, if the first sampled signal and the second sampled signal have the same logic level, then the output signal generated by the evaluator will have that same logic level. On the other hand, if the first sampled signal and the second sampled signal have different logic levels, then the output signal generated by the evaluator will transition to the opposite logic level from its previous logic state.

Another embodiment of the present invention comprises a method of sampling a signal. The method comprises sampling a data signal at an active transition of a clock to generate a first sampled signal, sampling the data signal at an active transition of an inverted clock to generate a second sampled signal, and generating an output signal at the active transition of the clock by evaluating the first sampled signal, the second sampled signal, and a previous logic state of the output signal. In some embodiments, the evaluating includes asserting the output signal if the first sampled signal is asserted and the second sampled signal is asserted, negating the output signal if the first sampled signal is negated and the second sampled signal is negated, and toggling the output signal if the first sampled signal and the second sampled signal are in opposite logic states.

Another embodiment of the present invention comprises a semiconductor device including at least one signal sampler according to the invention described herein.

Another embodiment of the present invention includes at least one semiconductor device including at least one signal sampler according to the present invention fabricated on a semiconductor wafer.

Yet another embodiment, in accordance with the present invention, comprises an electronic system including at least one input device, at least one output device, at least one processor and at least one memory device. The at least one memory device comprises at least one semiconductor memory incorporating at least one signal sampler according to the present invention.

BRIEF DESCRIPTION OF THE DRAWINGS

In the drawings, which illustrate what is currently considered to be the best mode for carrying out the invention.

DETAILED DESCRIPTION OF THE INVENTION

Figure 1:
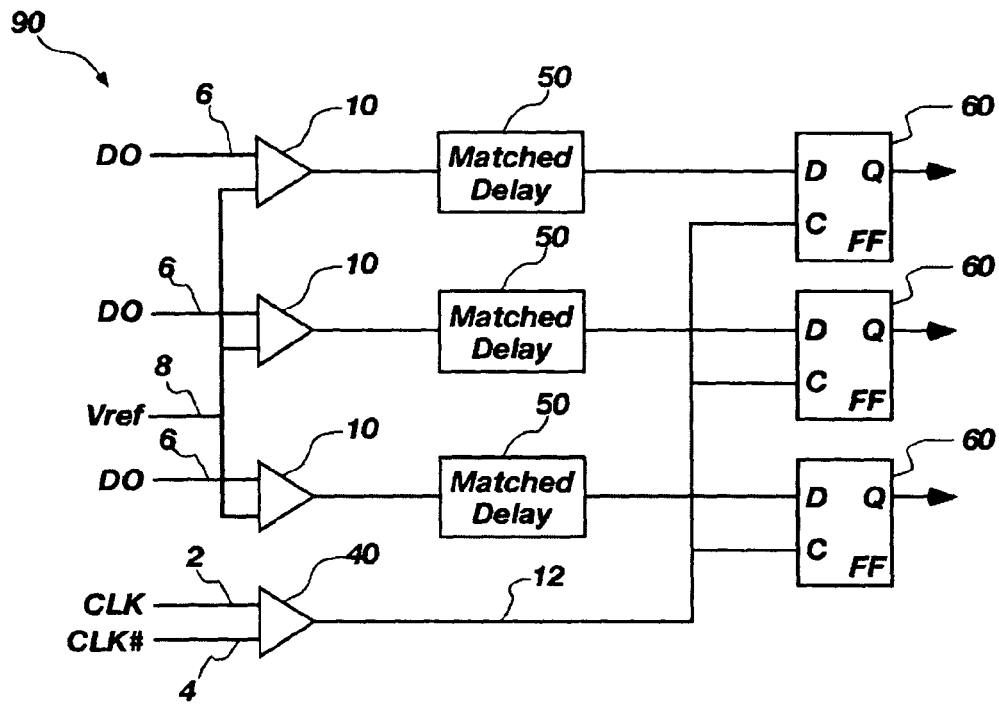
FIG. 1 is a block diagram of a conventional signal sampling implementation.

In the following description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations, and the like, have been omitted where such details are not necessary to obtain a complete understanding of the present invention and are within the abilities of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal.

The terms "assert" and "negate" are respectively used when referring to the rendering of a signal, status bit, or similar apparatus into its logically true or logically false state. Accordingly, if a logic level one or a high voltage represents a logically true state (i.e., asserted state), a logic level zero or a low voltage will represent the logically false state (i.e., negated state). Conversely, if a logic level zero or a low voltage represents the logically true state (i.e., asserted state), a logic level one or a high voltage will represent the logically false state (i.e., negated state).

In this description, "data signal" is used to indicate a signal to be sampled by one or more clocks. It will be readily apparent to those skilled in the art that the present invention may apply to any type of communication signal to be sampled. Therefore, the term "data signal" may apply to any signal to be sampled, such as, for example only, data signals, address signals, control, signals, status signals, and timing signals. Additionally, many of the drawings illustrate a bus of data signals. This is done to illustrate that many of the methods of the present invention may be applied across a wide bus of similar signal types, such as a data bus. However, the present invention may be implemented on any number of data signals, including a single data signal.

Uncertainty between arrival time of a data signal relative to arrival time of a clock at a sampling circuit reduces the sampling window of the data signal. A data valid window size and position relative to a sampling clock active edge may be affected by a variety of factors. Some of the most prominent factors creating shrinking sampling windows are:

1) delay mismatches between a data input and a clock input at the signal sampler;
2) different routing delays between clock and data;
3) fluctuations in a voltage reference used in high-speed differential input buffers, which may generate additional jitter in the output of differential input buffers; and
4) mismatches of high and low propagation delays, due to differing process parameters and buffer design, which may affect clock signals and data signals.

The conventional sampling circuit shown in FIG. 1 may address a portion of factors 1) and 2) by inserting a matched delay in the data signal line in an effort to match the data delay to a value similar to the clock delay. However, factors 1) and 2) may be more fully addressed by the present invention. Also, the FIG. 1 conventional circuitry does not address factors 3) and 4).

Figure 2:
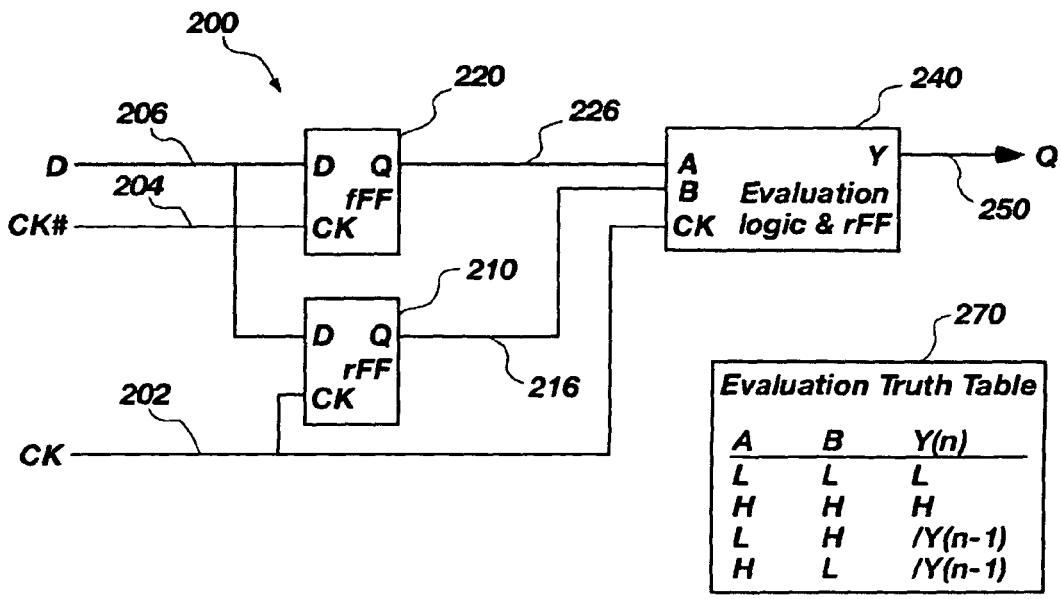
FIG. 2 is a block diagram of an exemplary signal sampler according to the present invention.

FIG. 2 illustrates a signal sampler 200 according to the present invention. The signal sampler 200 includes a first sampler 210, a second sampler 220 and an evaluator 240. The first sampler 210 is shown as a rising edge triggered flip-flop (rFF) and the second sampler 220 is shown as a falling edge triggered flip-flop (fFF). Additionally, the evaluator 240 is shown as containing evaluation logic and a rising edge triggered flip-flop. The active transition (i.e., rising edge or falling edge) is shown in FIG. 2 for the convenience of explanation. It will be readily apparent to those skilled in the art that the signal sampler 200 may be implemented with the first sampler 210 and evaluator 240 using a falling edge as the active transition rather than a rising edge and the second sampler 220 using a rising edge as the active transition rather than a falling edge. Therefore, for general discussion it may be more convenient to refer to an active edge, or active transition, while for discussions specific to FIG. 2 it may be more convenient to discuss a rising edge of the clock 202 and a falling edge of the inverted clock 204.

In operation of the signal sampler 200 of FIG. 2, the rising edge of the clock 202 and the falling edge of the inverted clock 204 will be substantially close to each other but may not match exactly. Routing and buffering differences between the clock 202 and the inverted clock 204 prior to reaching the signal sampler 200 may cause minor timing mismatches in these two signals. In addition, as noted in factors 1) and 2) above, routing and buffering differences between the data signal 206 and the clock signals 202 and 204 may cause timing mismatches between the data signal 206 and the clock signals 202 and 204 reducing the data sampling window at the signal sampler 200. Furthermore, due to buffer design and processing parameters, the data signal 206, the clock 202 and the inverted clock 204, may all have rise times and rising propagation delays that differ from fall times and falling propagation delays as noted in factor 4) above. For example, if a device is processed with fast n-channel devices and slow p-channel devices, the falling propagation delay of a signal may be faster than the rising propagation delay. Also, a buffer may be designed to have faster falling times than rising times, even if the process parameters are well matched, due to layout constraints or other considerations. The present invention compensates for this rising time versus falling time mismatch by using the second sampler 220 to capture the data signal 206 on a falling edge of the inverted clock 204, which may more closely match the falling edge of the data signal 206. Similarly, the first sampler 210, using a rising edge on the clock 202, may more closely match the rising edge of the data signal 206.

The resulting first sampled signal 216 and second sampled signal 226 are connected to the evaluator 240 to determine a final sampled value on an output signal 250. A truth table 270 shown in FIG. 2 defines the evaluation logic. If both the first sampled signal 216 and the second sampled signal 226 are at the same logic value, then that logic value will be used as the output signal 250 on the next active edge of the clock 202. In other words, if both the first sampled signal 216 and the second sampled signal 226 are low (as shown on the first line of the truth table 270), then the output signal 250 will be low on the next active edge of the clock 202. Conversely, if both the first sampled signal 216 and the second sampled signal 226 are high (as shown on the second line of the truth table 270), then the output signal 250 will be high on the next active edge of the clock 202.

This leaves only the conditions where the first sampled signal 216 and the second sampled signal 226 are in opposite logic states. If this is the case, it may be safe to assume that the data signal 206 transitioned. If no data signal 206 transition occurs, abundant set up time exists in which the data signal 206 is valid before the active edge of the clock 202 and the active edge of the inverted clock 204. In other words, both the first sampler 210 and second sampler 220 should have no trouble sampling the same value as that sampled on the previous active clock edge. Therefore, in the state where the first sampled signal 216 and the second sampled signal 226 disagree as to what the data signal 206 was at the active edge, the evaluator 240 assumes that the data signal 206 must have changed state from the previous clock and one of the samplers failed to capture the transition due to a lack of setup time at that sampler. In this scenario, the evaluation logic operates to feed back to the previous state of the output signal 250 so that the new state of the output signal 250 at the next active edge of the clock is opposite to that of the previous state, indicating that the data signal 206 has transitioned. This works whether the data signal 206 transition was from a low to high or from a high to a low. These states are shown as the third and fourth lines of the truth table 270. This evaluation mechanism effectively narrows the sampling window because a correct outcome for the output signal 250 is generated even when the first sampler 210 and second sampler 220 disagree on the logic value for the next state.

This signal sampler 200 may be used within a semiconductor device. For example, the signal sampler may be useful when data signals must be transferred between modules on the same semiconductor device across a long distance. The long distances may introduce significant skew between clocks and data, and therefore reduce input capture windows at the destination. In addition, the signal sampler may have even greater use for inputs to a semiconductor device.

Figure 3:
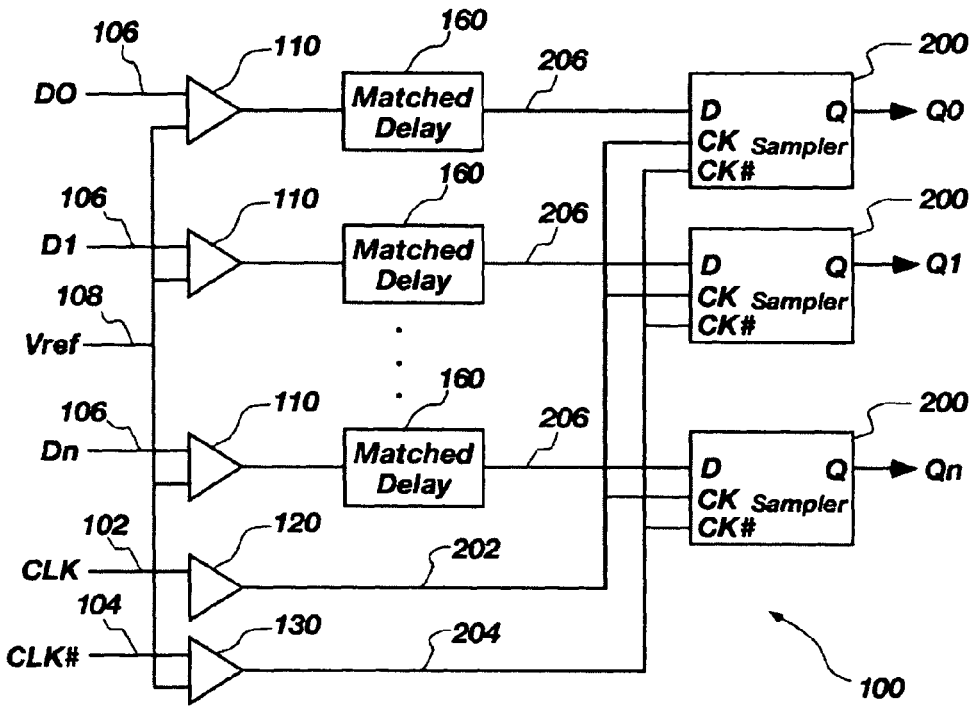
FIG. 3 is a block diagram of an exemplary application of the signal sampler showing dual differential clock buffers using a voltage reference for generating a clock signal and an inverted clock signal.

FIG. 3 shows an exemplary embodiment of an input structure 100 using the signal sampler 200 on input data signals 206 of a semiconductor device. In FIG. 3 the data inputs 106, an input clock 102 and an inverted input clock 104 are all connected to differential buffers (110, 120, and 130). Differential buffers are often used for semiconductor inputs to provide faster sensing of input signal transitions and allow adjustment of the transition point based on a voltage reference signal 108. In the FIG. 3 implementation, all the input signals (i.e., 102, 104, and 106) are connected to similar differential buffers 110, 120, and 130 with the same voltage reference signal 108. This addresses factor 3) identified previously. In factor 3), voltage fluctuation on the voltage reference signal 108 will cause jitter (or time fluctuations) on the output of the differential buffers (110, 120, and 130). By using similar differential buffers 110, 120, and 130 for the data signals 206 and the clock signals 202 and 204, the data sampling window may remain wider because the same time fluctuations occur on the data signals 206 and clock signals 202 and 204. As a result, most of the introduced time fluctuations may be canceled out. FIG. 3 also shows matched delays 160 on the data signals 206, which are used to match the delays on the clock signals 202 and 204. These matched delays 160 address some of factors 1) and 2) as defined above. Clock signals 202 and 204 may have significantly more load and buffering than data signals 206 and as a result have more delay. The matched delays 160 may contain metal routing, buffering, or a combination of buffering and metal routing so that the data delay substantially matches the delay associated with the clock signals 202 and 204.

Figure 4:
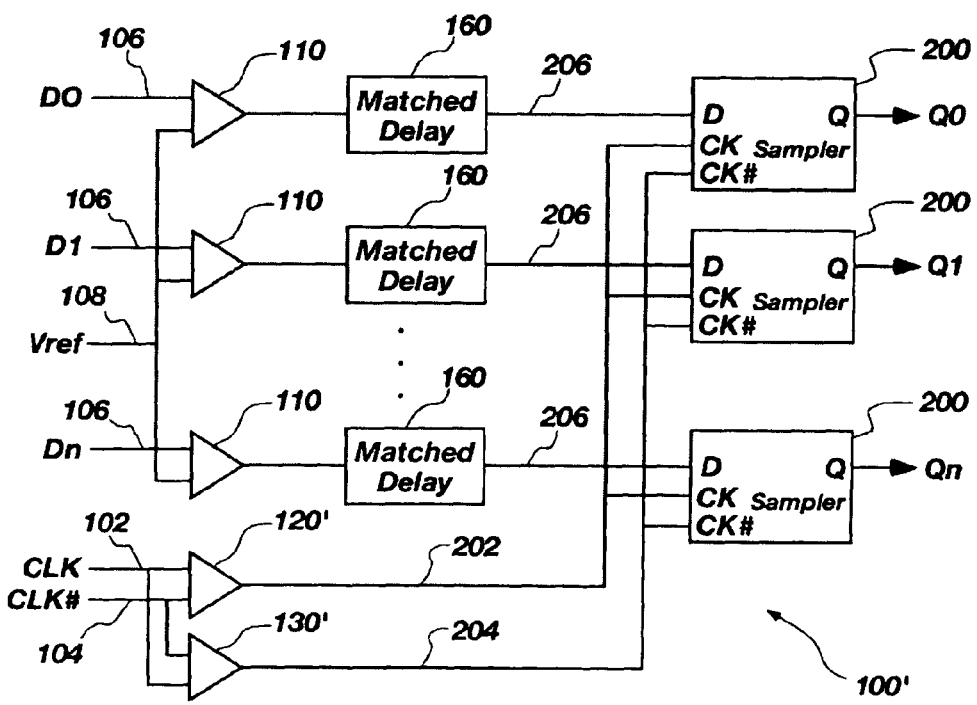
FIG. 4 is a block diagram of an exemplary application of the signal sampler showing dual differential clock buffers for generating a clock signal and an inverted clock signal.

FIG. 4 shows another exemplary embodiment of an input structure 100' using the signal sampler 200 on input data signals 206. In this embodiment, it may be more important to detect accurate transitions on the input clock 102 and inverted input clock 104 without introducing the possible time jitter, which may be present in the FIG. 3 embodiment. In the FIG. 4 embodiment, a first differential clock buffer 120' and a second differential clock buffer 130' connect to the input clock 102 and inverted input clock 104. The differential clock buffers 120' and 130' do not use the voltage reference signal 108. Rather, the first differential clock buffer 120' asserts the clock 202 when the input clock 102 has a higher voltage than the inverted input clock 104 and negates the clock 202 when the input clock 102 has a lower voltage than the inverted input clock 104. In a similar fashion, but with an inverted signal, the second differential clock buffer 130' asserts the inverted clock 204 when the inverted input clock 104 has a higher voltage than the input clock 102 and negates the inverted clock 204 when the inverted input clock 104 has a lower voltage than the input clock 102. This embodiment may generate more accurate transitions of the internal clocks relative to the input clocks 102, yet still use the signal sampler 200 to improve the sampling window. Similar to the FIG. 3 embodiment, the data inputs 106 are connected to first differential buffers 110 using the voltage reference signal 108. Matched delays 160 may be used to more closely match delays on the data signals 206 to the delays of the clock 202 and inverted clock 204 prior to arriving at the signal samplers 200.

Figure 5:
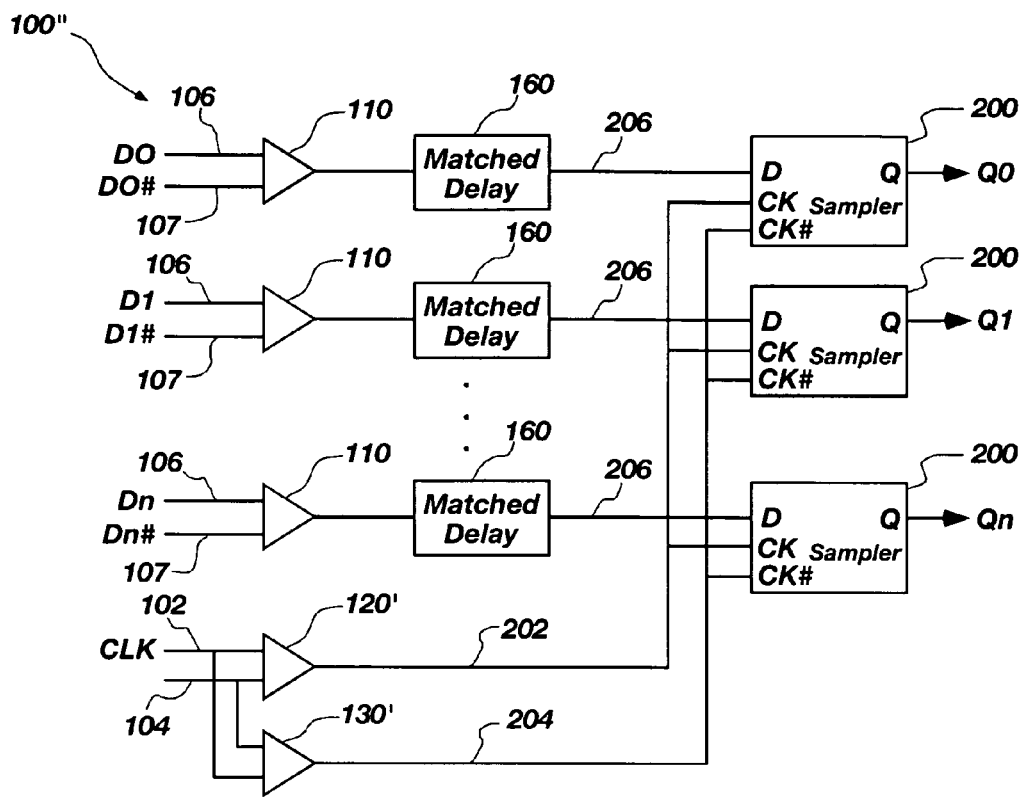
FIG. 5 is a block diagram of an exemplary application of the signal sampler showing differential buffers for data inputs and dual differential clock buffers for generating a clock signal and an inverted clock signal.

FIG. 5 shows another exemplary embodiment of an input structure 100" using the signal sampler 200. In this embodiment, as an extension to the FIG. 4 embodiment, it may be important to detect more accurate transitions on the data input 106. Some systems may be configured with a data input 106 and inverted data input 107 for each bit on a data bus. Rather than using the reference signal 108 to determine a transition point, the FIG. 5 embodiment connects the differential buffer 110 to a data input 106 and inverted data input 107. This configuration may generate a more accurate transition detection without introducing the possible time jitter or time skews on the data inputs 106 due to variations in the reference signal 108 of the FIG. 4 embodiment). As with the FIG. 4 embodiment, the FIG. 5 embodiment shows dual differential clock buffers (120' and 130') to generate the clock 202 and inverted clock 204 used by the signal samplers 200. This embodiment may generate more accurate transitions of the internal data signal 206 relative to the clock 202 and inverted clock 204 for use by the signal sampler 200 to improve the sampling window.

Figure 6:
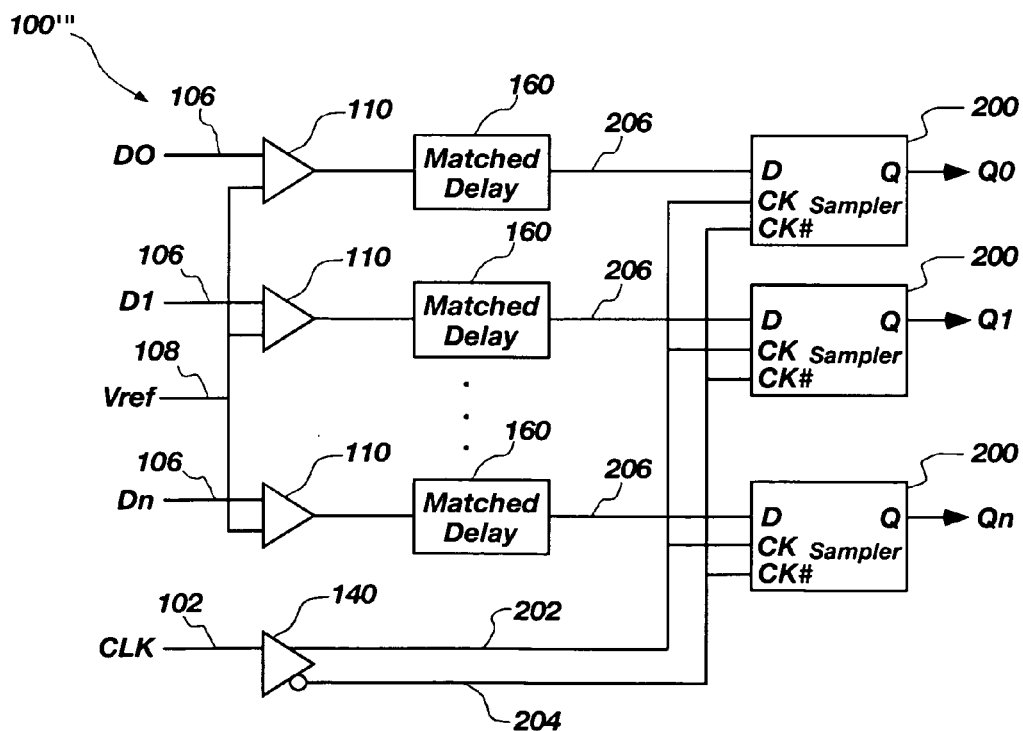
FIG. 6 is a block diagram of an exemplary application of the signal sampler showing a clock buffer for generating a clock signal and an inverted clock signal.

FIG. 6 shows another exemplary embodiment of an input structure 100''' using the signal sampler 200 on input data signals 206. Some systems may not include the input clock and inverted input clock for use by a receiving device. The present invention may still be practiced with data inputs 106 by using a clock buffer 140 (FIG. 6) that generates the clock 202 and inverted clock 204 from a single input clock 102. Similar to the FIGS. 3 and 4 embodiments, the data inputs 106 are connected to first differential buffers 110 using the voltage reference signal 108 (not shown). Matched delays 160 may be used to match delays of the data signals 206 to the delays of the clock 202 and inverted clock 204 prior to arriving at the signal samplers 200.

Figure 7:
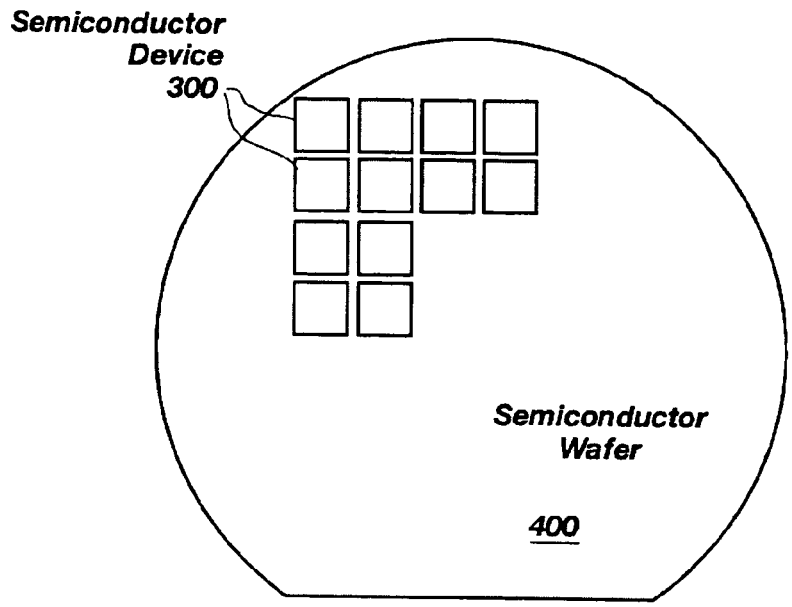
FIG. 7 is a schematic depiction of a semiconductor wafer including a plurality of semiconductor devices including a signal sampler according to the present invention.

As shown in FIG. 7, a semiconductor wafer 400, in accordance with the present invention, includes a plurality of semiconductor devices 300 incorporating the signal sampler 200 (not shown in FIG. 7) described herein. Of course, it should be understood that the semiconductor devices 300 may be fabricated on substrates other than a silicon wafer, such as, for example, a Silicon On Insulator (SOI) substrate, a Silicon On Glass (SOG) substrate, or a Silicon On Sapphire (SOS) substrate, a gallium arsenide wafer, an indium phosphide wafer, or other bulk semiconductor substrate. As used herein, the term "wafer" includes and encompasses all such substrates.

Figure 8:
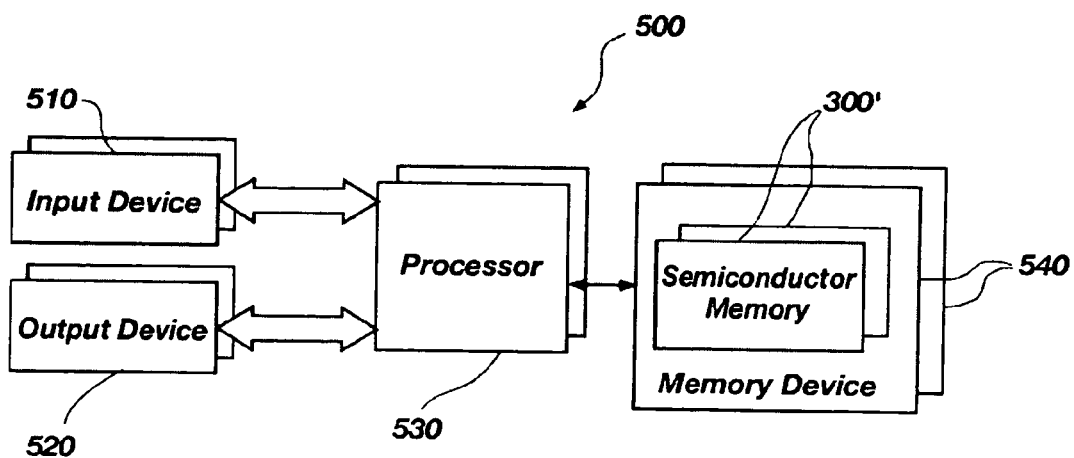
FIG. 8 is an electronic system diagram showing a plurality of semiconductor memories including a signal sampler according to the present invention.

As shown in FIG. 8, an electronic system 500, in accordance with the present invention, comprises at least one input device 510, at least one output device 520, at least one processor 530, and at least one memory device 540. The memory device 540 comprises at least one semiconductor memory 300' incorporating the signal sampler 200 (not shown in FIG. 8) described herein in a DRAM device. It should be understood that the semiconductor memory 300' may comprise a wide variety of devices other than, or in addition to, a DRAM, including, for example, Static RAM (SRAM) device and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of sampling a signal, comprising:
storing a first logic state of a data signal at each active transition of a sample clock;
storing a second logic state of the data signal at a next transition of the sample clock, wherein the
next transition is in a direction opposite to each active transition;
generating an output signal at each active transition of the sample clock as:
asserted if the first logic state and the second logic state are asserted;
negated if the first logic state and the second logic state are negated; and
inverted relative to a previous logic state of the output signal if the first logic state and the second logic state are different.

2. The method of claim 1, wherein each active transition is selected from the group consisting of a rising edge and a falling edge.

3. The method of claim 1, further comprising a delaying act selected from the group consisting of delaying the data signal by a predetermined delay amount so an arrival time of the data signal at a signal sampler is substantially near an arrival time of the sample clock, delaying the sample clock by a predetermined delay amount so an arrival time of the data signal at a signal sampler is substantially near an arrival time of the sample clock, and combinations thereof.

4. The method of claim 3, further comprising comparing a data input to a reference signal to assert the data signal if a voltage of the data input is higher than a voltage of the reference signal and negate the data signal if the voltage of the data input is lower than the voltage of the reference signal.

5. The method of claim 3, further comprising comparing a data input and an inverted data input to assert the data signal if a voltage of the data input is higher than a voltage of the inverted data input and negate the data signal if the voltage of the data input is lower than the voltage of the inverted data input.

6. The method of claim 3, further comprising comparing a clock input to a reference signal to assert the sample clock if a voltage of the clock input is higher than a voltage of the reference signal and negate the sample clock if the voltage of the clock input is lower than the voltage of the reference signal.

7. The method of claim 3, further comprising comparing a clock input and an inverted clock input to assert the sample clock if a voltage of the clock input is higher than a voltage of the inverted clock input and negate the sample clock if the voltage of the clock input is lower than the voltage of the inverted clock input.

8. A signal sampler, comprising:
a first sampler configured to sample a data signal at each active transition of a clock and generate a first sampled signal;
a second sampler configured to sample the data signal at a next transition of the clock to generate a second sampled signal, wherein the next transition is in a direction opposite to each active transition; and
an evaluator configured for modifying an output signal at the active transition of the clock by:
asserting the output signal when the first sampled signal and the second sample signal are asserted;
negating the output signal when the first sampled signal and the second sample signal are negated; and inverting the output signal relative to a previous logic state of the output signal when the first sampled signal and the second sampled signal are different.

9. The signal sampler of claim 8, wherein each active transition is selected from the group consisting of a rising edge and a falling edge.

10. The signal sampler of claim 8, further comprising:
a first input buffer operably coupled between a data input and the data signal; and
a second input buffer operably coupled to an input clock and an inverted input clock and configured to generate the clock.

11. The signal sampler of claim 10, further comprising a matched delay operably coupled to an output of the first input buffer and configured to delay the data signal by a predetermined delay amount so an arrival time of the data signal to the signal sampler is substantially near an arrival time of the clock at the first signal sampler and the second signal sampler.

12. The signal sampler of claim 10, wherein the first input buffer comprises a first differential buffer operably coupled to the data input and a reference signal, the first differential buffer configured to assert the data signal if a voltage of the data input is higher than a voltage of the reference signal and negate the data signal if the voltage of the data input is lower than the voltage of the reference signal.

13. The signal sampler of claim 10, wherein the first input buffer comprises a first differential buffer operably coupled to the data input and an inverted data input, the first differential buffer configured to assert the data signal if a voltage of the data input is higher than a voltage of the inverted data input and negate the data signal if the voltage of the data input is lower than the voltage of the inverted data input.

14. The signal sampler of claim 8, further comprising a differential clock buffer operably coupled to an input clock and a reference signal and configured to assert the clock if a voltage of the input clock is higher than a voltage of the reference signal and negate the clock if the voltage of the input clock is lower than the voltage of the reference signal.

15. The signal sampler of claim 8, further comprising a differential clock buffer operably coupled to an input clock and an inverted input clock and configured to assert the clock if a voltage of the input clock is higher than a voltage of the inverted input clock and negate the clock if the voltage of the input clock is lower than the voltage of the inverted input clock.

16. A semiconductor device including at least one signal sampler, the at least one signal sampler comprising:
a first sampler configured to sample a data signal at each active transition of a clock and generate a first sampled signal;
a second sampler configured to sample the data signal at a next transition of the clock to generate a second sampled signal, wherein the next transition is in a direction opposite to each active transition; and
an evaluator configured for generating an output signal at each active transition of the clock responsive to an evaluation of the first sampled signal, the second sampled signal and a previous logic state of the output signal as:
asserted if the first sampled signal is asserted and the second sampled signal is asserted;
negated if the first sampled signal is negated and the second sampled signal is negated; and
inverted relative to the previous logic state if the first sampled signal and the second sampled signal are different.

17. An electronic system, comprising:
at least one input device;
at least one output device;
at least one processor; and
at least one memory device comprising, at least one semiconductor memory including at least one signal sampler, the at least one signal sampler comprising:
a first sampler configured to sample a data signal at each active transition of a clock and generate a first sampled signal;
a second sampler configured to sample the data signal at a next transition of the clock to generate a second sampled signal, wherein the next transition is in a direction opposite to each active transition; and
an evaluator configured for modifying an output signal at the active transition of the clock by:
asserting the output signal when the first sampled signal and the second sample signal are asserted;
negating the output signal when the first sampled signal and the second sample signal are negated; and
inverting the output signal relative to a previous logic state of the output signal when the first sampled signal and the second sampled signal are different.

* * * * *